United States Patent [19]
Shimoji

[11] Patent Number: 5,278,440
[45] Date of Patent: Jan. 11, 1994

[54] SEMICONDUCTOR MEMORY DEVICE WITH IMPROVED TUNNELING CHARACTERISTICS

[76] Inventor: Noriyuki Shimoji, c/o Rohm Co., Ltd., 21, Saiin Mizosaki-cho, Ukyo-ku, Kyoto, 615, Japan

[21] Appl. No.: 846,490

[22] Filed: Mar. 3, 1992

[30] Foreign Application Priority Data

Jul. 8, 1991 [JP] Japan .................... 3-166845

[51] Int. Cl.$^5$ .................... H01L 29/68; G11C 11/34
[52] U.S. Cl. .................... 257/324; 257/325; 257/317; 365/184
[58] Field of Search ........... 257/324, 325, 326, 317; 365/184

[56] References Cited

U.S. PATENT DOCUMENTS

| | | | |
|---|---|---|---|
| 3,805,130 | 4/1974 | Yamazaki | 257/325 |
| 4,099,196 | 7/1978 | Simko | 257/317 |
| 4,619,034 | 10/1986 | Janning | 257/324 |

OTHER PUBLICATIONS

Yatsuda et al., *An Advanced MNOS Memory Device for Highly-Integrated Byte-Erasable 5V-Only EEPROMs*, IEDM, p. 734, 1982.

Primary Examiner—William Mintel
Assistant Examiner—Robert Limanek
Attorney, Agent, or Firm—Falk, Vestal & Fish

[57] ABSTRACT

A semiconductor memory is disclosed. The cell has MNOS structure, and comprises a p-type silicon substrate 27 with n type layers 21, 23, a silicon dioxide film 19 thereon, a reduced pressure SiN film 17 thereon and a polysilicon film 14 thereon. The surface of the channel region 25 has projecting portions so the semiconductor memory employing the cell, compared to that of the prior art, permits tunneling of electrons with a low programming voltage.

6 Claims, 11 Drawing Sheets

SEMICONDUCTOR MEMORY DEVICE WITH IMPROVED TUNNELING CHARACTERISTICS

BACKGROUND OF THE INVENTION

1. Field of the Invention

This invention relates to semiconductor memories and, more particularly, to improvement of the tunneling efficiency of nonvolatile semiconductor memories.

2. Description of the prior art

Figure 1A:
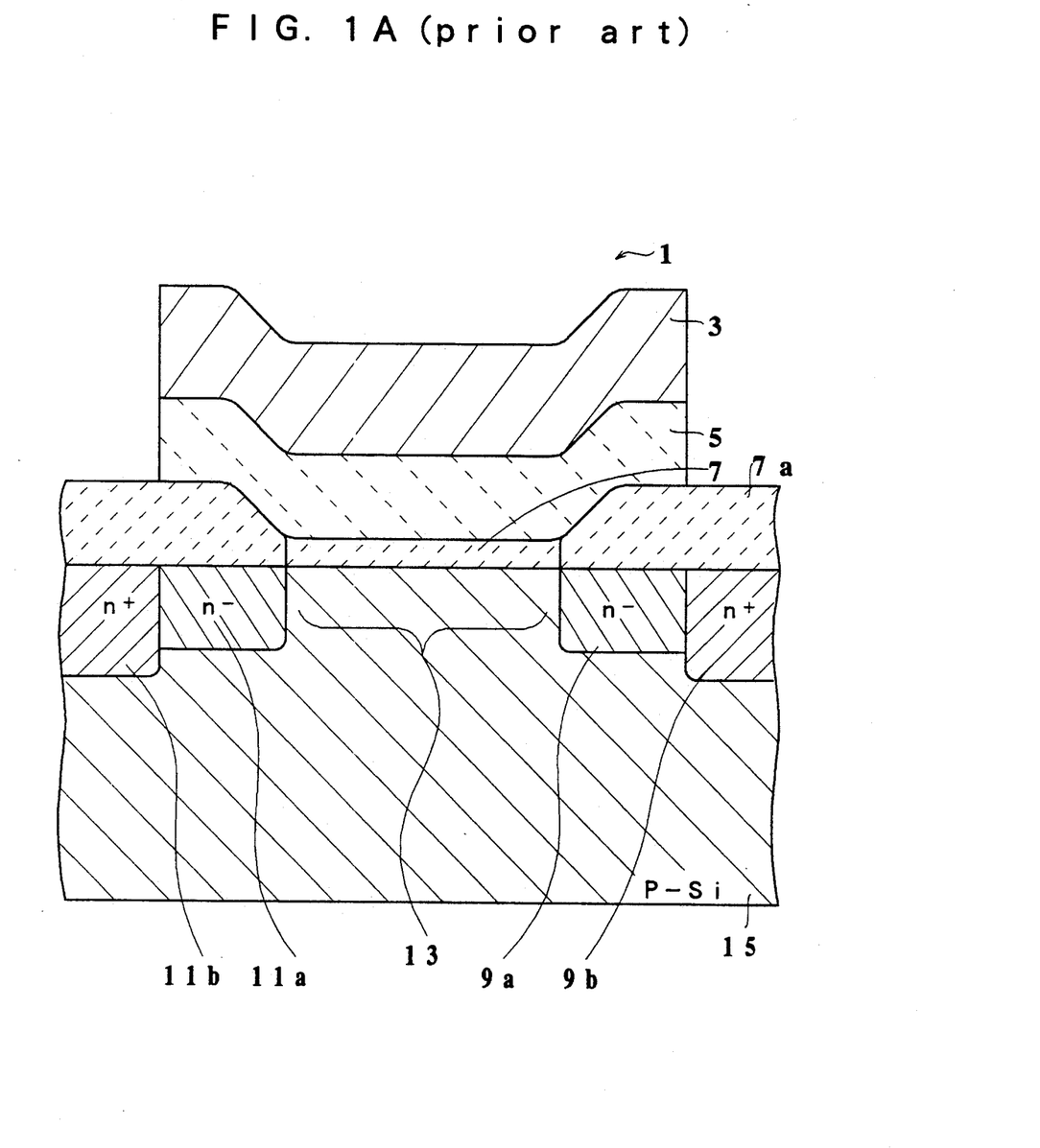
FIG. 1A is a schematic sectional view of a prior art memory cell 1.

FIG. 1A illustrates a schematic sectional view of a memory cell 1 of a prior art semiconductor memory (Yatsuda et al., "An advanced MNOS memory device for highly-integrated byte-erasable 5V-only EE-PROMs", IEDM, 1982, p.734).

The manufacturing process of the memory cell 1 having the structure shown in FIG. 1A will now be described with reference to FIGS. 2 and 3.

Figure 2A:
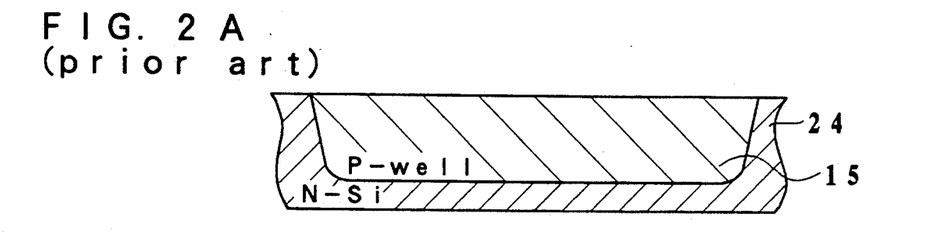
FIGS. 2A-2E are part of a series of views illustrating the manufacturing process of the prior art memory cell 1.
Figure 2B:
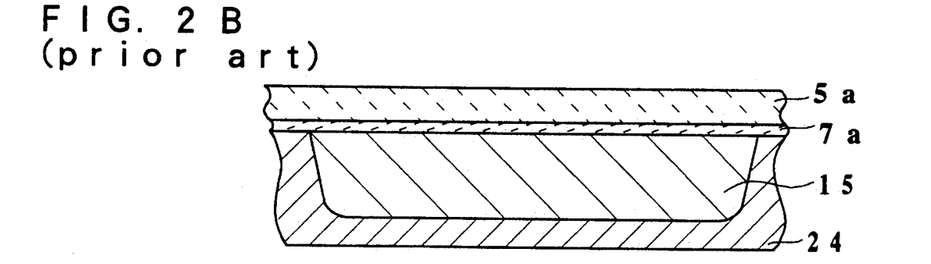
Figure 2C:
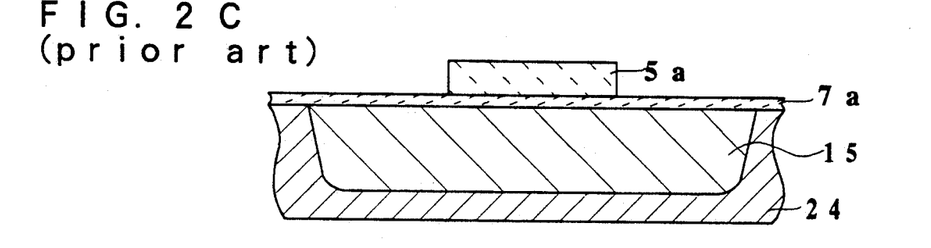
Figure 2D:
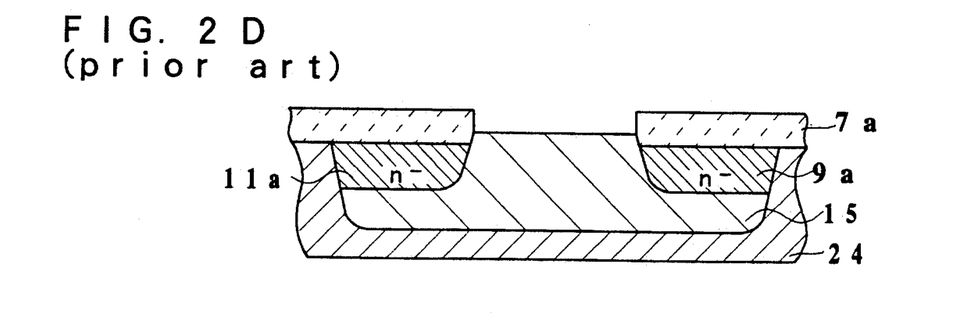
Figure 2E:
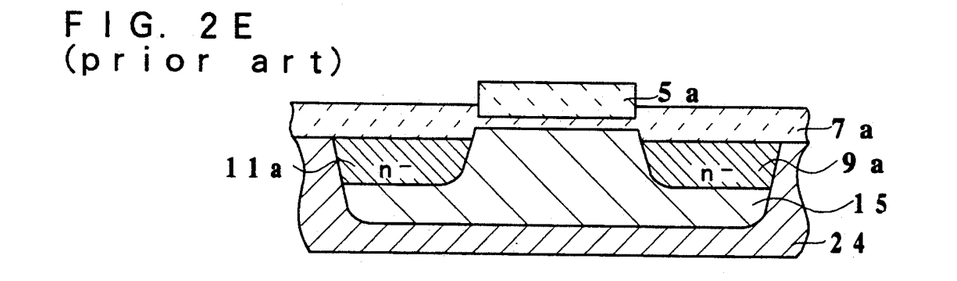
Figure 3F:
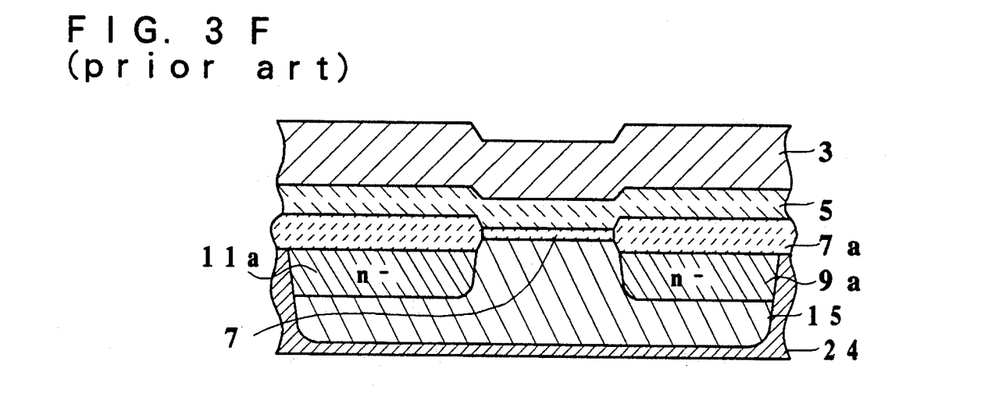
FIGS. 3F-3G are the rest of the series of views illustrating the manufacturing process of the prior art memory cell 1.
Figure 3G:
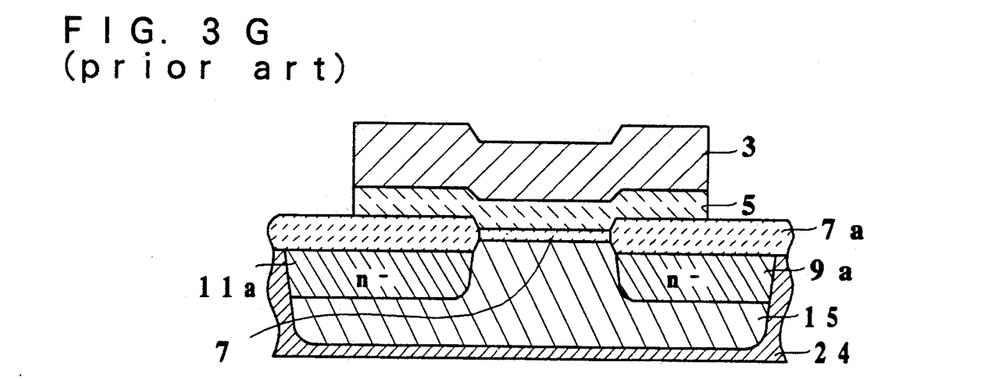

In an n-type silicon substrate 24, a p-type well layer 15 is formed by ion implantation (FIG. 2A). On the surface, a silicon dioxide layer 7a is formed by thermal oxidization. Then a reduced pressure SiN (nitride) film 5a is deposited by a reduced pressure CVD (LPCVD) process (FIG. 2B). The reduced pressure SiN film 5a is then selectively etched away to leave only a portion of it above a portion of the p-well 15 which will eventually form a channel region (hereafter referred to as the eventual channel region, FIG. 2C). Thermal oxidation is performed again, and then an n⁻type layer, comprised of segments 9a and 11a, is formed by ion implantation and thermal diffusion (FIG. 2D). The remaining reduced pressure SiN film 5a and a portion thereunder of the silicon dioxide film 7a are etched away by dipping them in a wet etching solution (FIG. 2E). Next, on the eventual channel region, an Ultra Thin Oxide film (hereafter UTO) 7 is formed by thermal oxidation, and then a reduced pressure SiN film 5 is deposited on the UTO 7 and the silicon dioxide layers 7a by the reduced pressure CVD process. Then, a polysilicon film 3 is grown on the film 5 by the CVD process (FIG. 3F). The polysilicon film 3 and reduced pressure SiN film 5 are selectively etched away using a resist mask (FIG. 3G). Then, an n⁺type layers 9b and 11b (see FIG. 1A) are formed by ion implantation and thermal diffusion. Meanwhile, the eventual channel means a region 13 between a drain layer 9a, 9b and a source layer 11a, 11b.

Figure 1B:
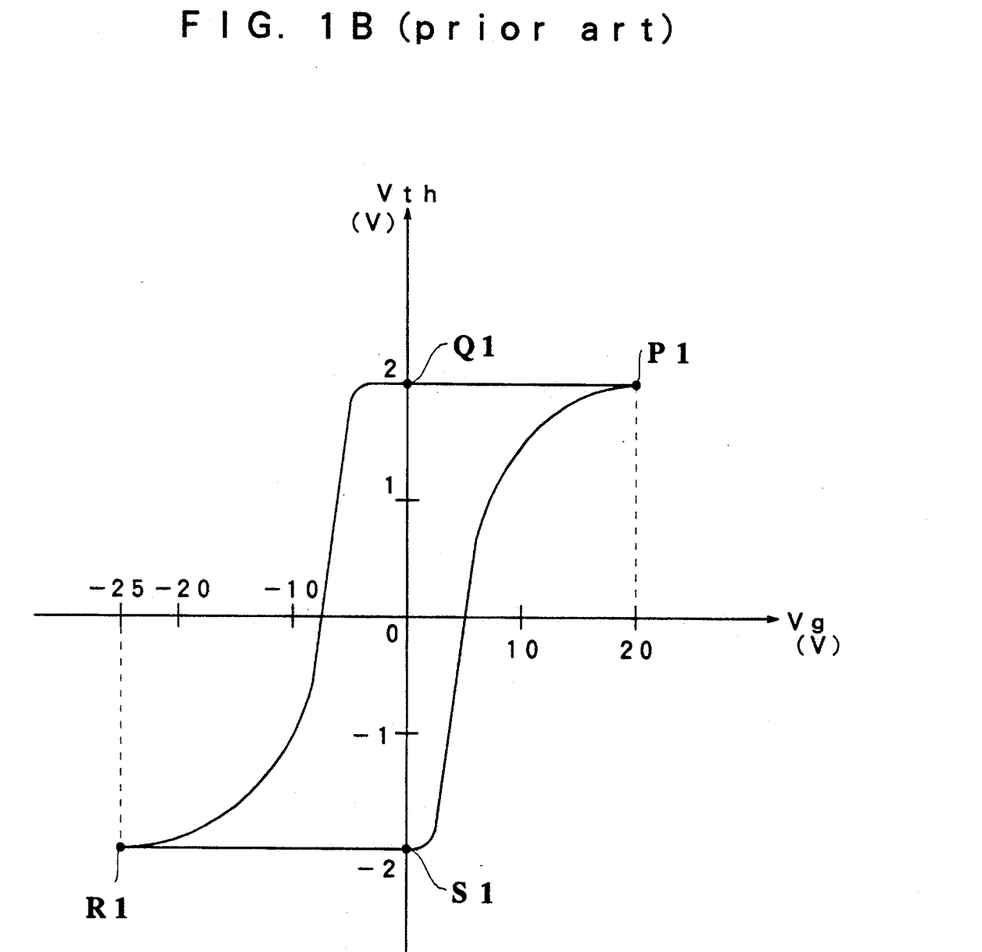
FIG. 1B is a view showing the hysteresis loop of the memory cell 1.

The above memory cell 1 can be in one of two different states: an information "1" state, in which electrons are trapped in the SiN film 5; and an information "0" state, in which no electrons are trapped in the SiN film 5. To explain two states, the hysteresis loop of the memory cell 1 is shown in FIG. 1B. The horizontal axis in FIG. 1B represents gate voltage $V_g$ and the vertical axis represents threshold voltage $V_{th}$. The gate voltage $V_g$ is a voltage applied to the gate electrode of the memory cell. The threshold voltage $V_{th}$ is a gate voltage at which a current begins to flow between the source and the drain when the voltage applied to the gate electrode is made to increase. In this case, the threshold voltage $V_{th}$ is given by $$V_{th} = 2\phi F + V_{FB} + \frac{1}{C} \times \sqrt{2\epsilon q N_A 2\phi F}$$

where $\epsilon$ is silicon dielectric constant, $N_A$ is the concentration of impurities within the substrate, $V_{FB}$ is the flat band voltage, C is the capacity of the gate insulating film, q is the quantity of electron charge, and $\phi F$ is the Fermi level (i.e. the potential of an intrinsic semiconductor from Fermi level).

In the initial state of the memory cell 1, no electrons are trapped in the SiN film 5. In this state, by applying a high voltage of about 20 V (not shown) to the gate electrode 3 of the memory cell 1, an electric field is set up between the gate electrode 3 and channel region 13. At this time, electrons in the channel region 13 are pulled by the electric field and acquire high energy, and some electrons tunnel through the silicon dioxide film 7 and enter and are trapped within the SiN film 5. This means that information "1" is written in the memory cell 1. Such a change causes the threshold voltage to increase up to the positive (see P1 in FIG. 1B). This means that the memory cell 1 has been made to serve as an enhancement mode transistor having a threshold voltage of the positive. In addition, the threshold voltage will remain as it is even if the gate voltage is cut off (see Q1 in FIG. 1B).

On the other hand, to erase the information "1", it is necessary to let the trapped electrons return to the channel region 13. This is effected by generating an electric field of the opposite polarity to that produced when writing information, by applying a high voltage of about 25 V to the channel region 13. The result after erasing the information "1" is a state in which information "0" is written. Such a change causes the threshold voltage to change from the positive to the negative (see R1 in FIG. 1B). This means that the memory cell 1 has been made to serve as a depression mode transistor having a threshold voltage of the negative. In addition, the threshold voltage will remain as it is even if the gate voltage is cut off (see S1 in FIG. 1B).

When reading out information, a judgement as to whether the written information is "0" or "1" can be made by checking whether a current flows through the channel region 13 when approximately 5 V is applied between the source 11a, 11b and drain 9a, 9b of the memory cell 1.

More specifically, when information "0" is written (i.e., when no electrons are trapped in the SiN film 5), the memory cell 1 is a depletion mode transistor, and the channel region 13 is thus energized. In this state, current flows through the channel region 13. When information "1" is stored (i.e., when electrons are trapped in the SiN film 5), the memory cell 1 is an enhancement mode transistor, and the channel region 13 is not energized. Hence, no current flows through the channel region 13.

As shown above, with respect to the memory cell 1, writing or erasing information requires application of a high voltage of 20 to 25 V. Therefore, the memory cell 1 has a high breakdown voltage structure, as shown in FIG. 1A.

The prior art semiconductor memory employing this memory cell 1 has the following problems.

Writing information "1" to the memory cell 1 (i.e., injection of electrons into the SiN film 5 for trapping) or erasing information requires application of the high voltage to the gate electrode 3.

With the application of the high voltage to the gate electrode 3, excessive stress is placed on the silicon dioxide film 7 and its reliability is reduced. Therefore, the memory cell 1 required the high breakdown voltage structure. The high breakdown voltage structure inhibits increase of integration density due to the large size of the memory cell 1, as shown in FIG. 1A. Further, the manufacturing process of the memory cell 1 with the high breakdown voltage structure is complicated (see FIG. 2), thus posing problems in connection with manufacturing efficiency.

SUMMARY OF THE INVENTION

The present invention seeks to solve the problems described above, with the aim of providing a semiconductor memory which, compared to the prior art, permits tunneling of electrons with a low programming voltage.

A nonvolatile memory cell in accordance with the present invention comprises:

a semiconductor region of a first conductivity type formed in a substrate;

first and second regions of a second conductivity type formed in the first conductivity type semiconductor region;

a third region defined between the first and second regions, the surface of the third region having at least one projecting portion or surface roughness;

a first insulating film formed on the projecting portion;

a second insulating film formed on the first insulating film; and a gate electrode formed on the second insulating film.

A method for manufacturing a nonvolatile memory cell in accordance with the teachings of the present invention comprises steps of:

providing a semiconductor region of a first conductivity type in a substrate constituted by a semiconductor single crystal;

forming at least one projecting portion or rough spot on the surface of the first conductivity type semiconductor region by forming a resist pattern on the surface of the first conductivity type semiconductor region and performing selective etching using the resist pattern used as a mask;

removing the resist pattern and forming a first insulating film on the projecting portion or rough spot;

depositing a second insulating film on the first insulating film and then growing an electrode on the second insulating film;

etching the electrode using a resist pattern as a mask to form a gate electrode; and forming first and second regions of the second conductivity type by diffusing an impurity of the second conductivity type in the first conductivity type semiconductor region.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENT

Figure 4A:
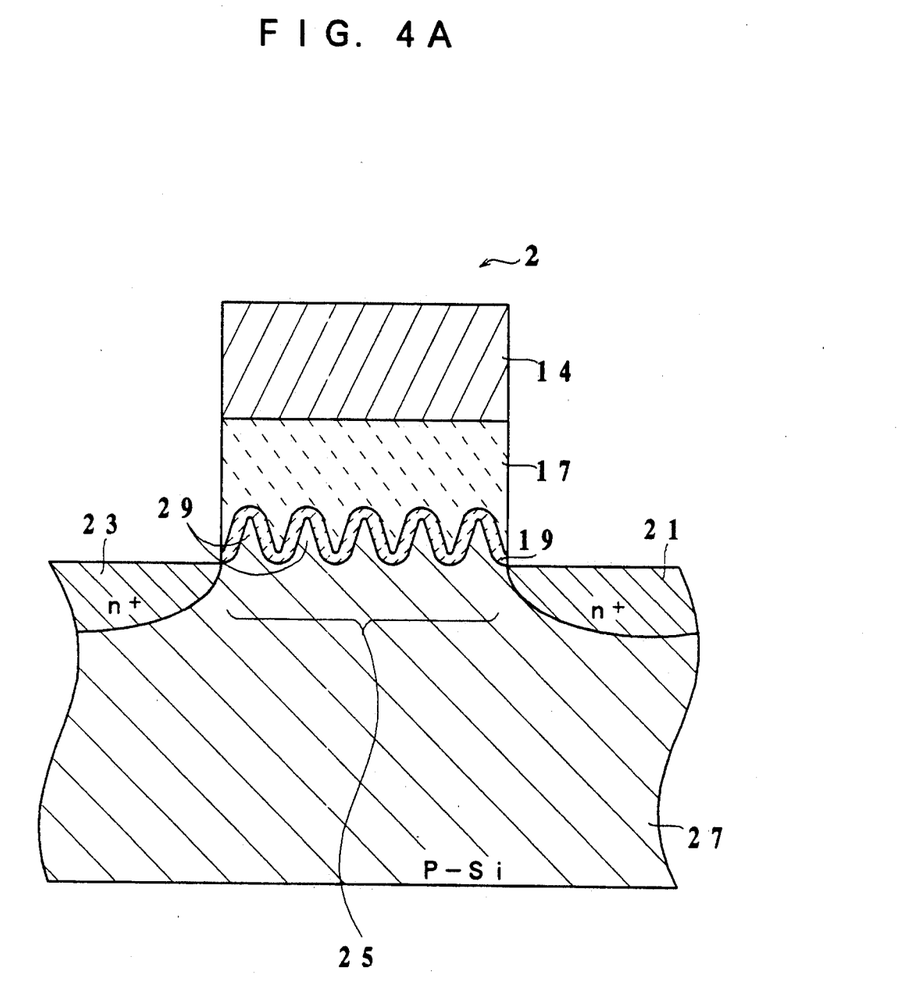
FIG. 4A is a schematic sectional view of the memory cell 2 embodying the present invention.

FIG. 4A is a schematic sectional view of a memory cell 2 in a semiconductor memory embodying this invention.

The manufacturing process of the memory cell 2 having the structure shown in FIG. 4A will now be described with reference to FIG. 5.

Figure 5A:
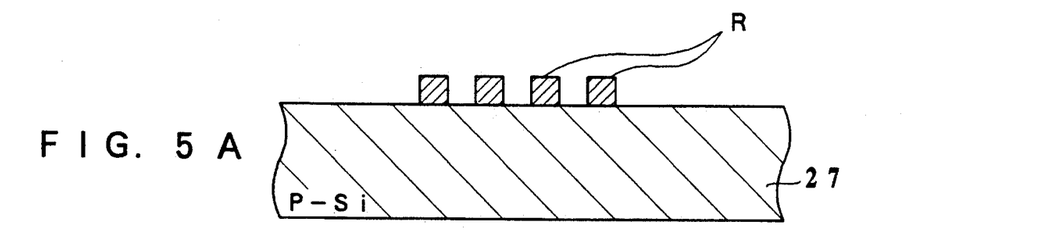
FIGS. 5A-5E are a series of views illustrating the manufacturing process of the memory cell 2.
Figure 5B:
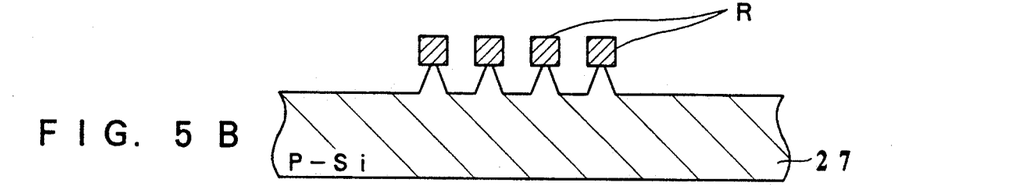
Figure 5C:
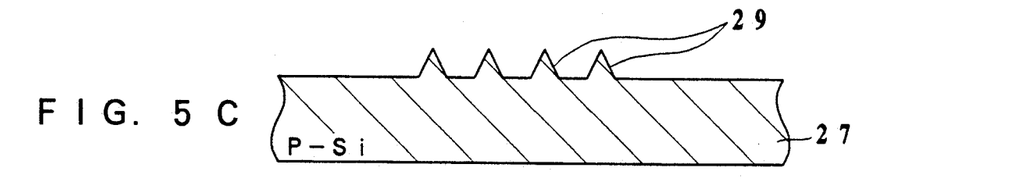
Figure 5D:
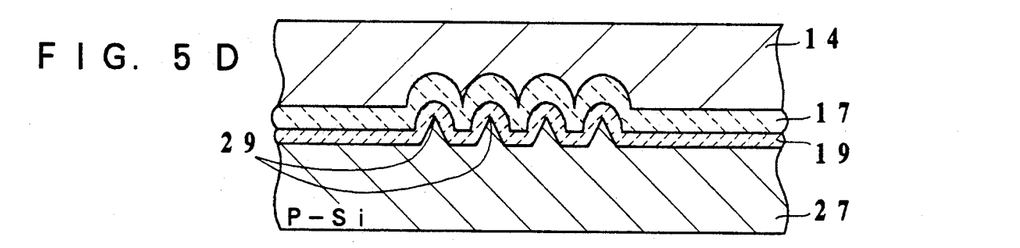
Figure 5E:
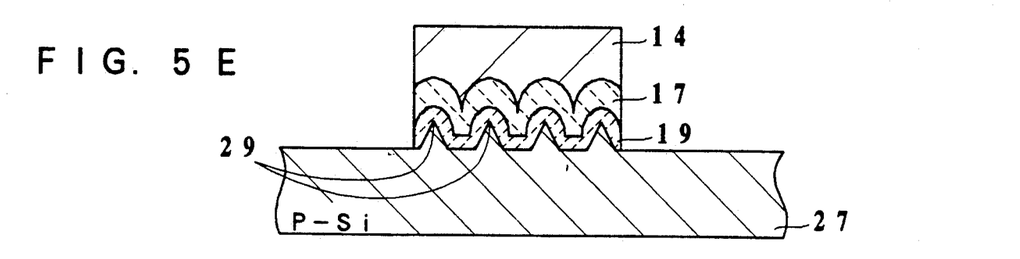

On the surface of a p-type silicon substrate 27, which is a first conductivity type semiconductor region, a resist R (FIG. 5A) is formed and is used as a mask for isotropic etching of the p-type silicon substrate 27 (FIG. 5B). Then the resist is removed to complete formation of projecting portions 29 (FIG. 5C). Subsequently, a silicon dioxide film 19 is formed to a thickness of about 2 nm as a first insulating film by thermal oxidation. On the silicon dioxide film 19, a reduced pressure SiN film 17 is deposited to a thickness of about 50 nm, as a second insulating film, by the reduced pressure CVD process. A polysilicon film 14 is then grown as a gate electrode by the CVD process(FIG. 5D). A resist is then provided on the polysilicon film 14, and then the silicon dioxide film 19, the reduced pressure SiN film 17, and the polysilicon film 14 are selectively etched (FIG. 5E). Then, a n+type drain layer 21, which is a first region of a second conductivity type, and a n+type source layer 23, which is a second region of the second conductivity type, are formed by ion implantation of arsenic and phosphorus and thermal diffusion (FIG. 4A). At this point, a region 25 between the drain layer 21 and the source layer 23 is hereafter referred to as a channel region which is a third region.

The memory cell 2 having the above structure can be in one of two states: an information "1" state, in which electrons are trapped in the SiN film 17; and an information "0" state, in which no electrons are trapped in the SiN film 17.

In the initial state of the memory cell 2, no electrons are trapped in the SiN film 17. In this state, by applying a voltage of only about 10 V to the polysilicon film 14, an electric field is generated. This electric field is locally enhanced by the projection portions 29, as can be seen from the electric force lines 16 shown in FIG. 6. That is, on the surface of the channel region 25, the projecting portions 29 have a very high electric field compared to the other portions. In other words, even with a voltage of only about 10 V, the generated electric field is sufficiently strong to pull electrons in the channel region 25 effectively. Numerous electrons are thus pulled out from the channel region 25 and tunnel through the silicon dioxide film 19, to enter and become trapped in the SiN film 17. This means that information "1" is written to the memory cell 2. The memory cell 2 with the information "1" written therein is an enhancement mode transistor.

Figure 6:
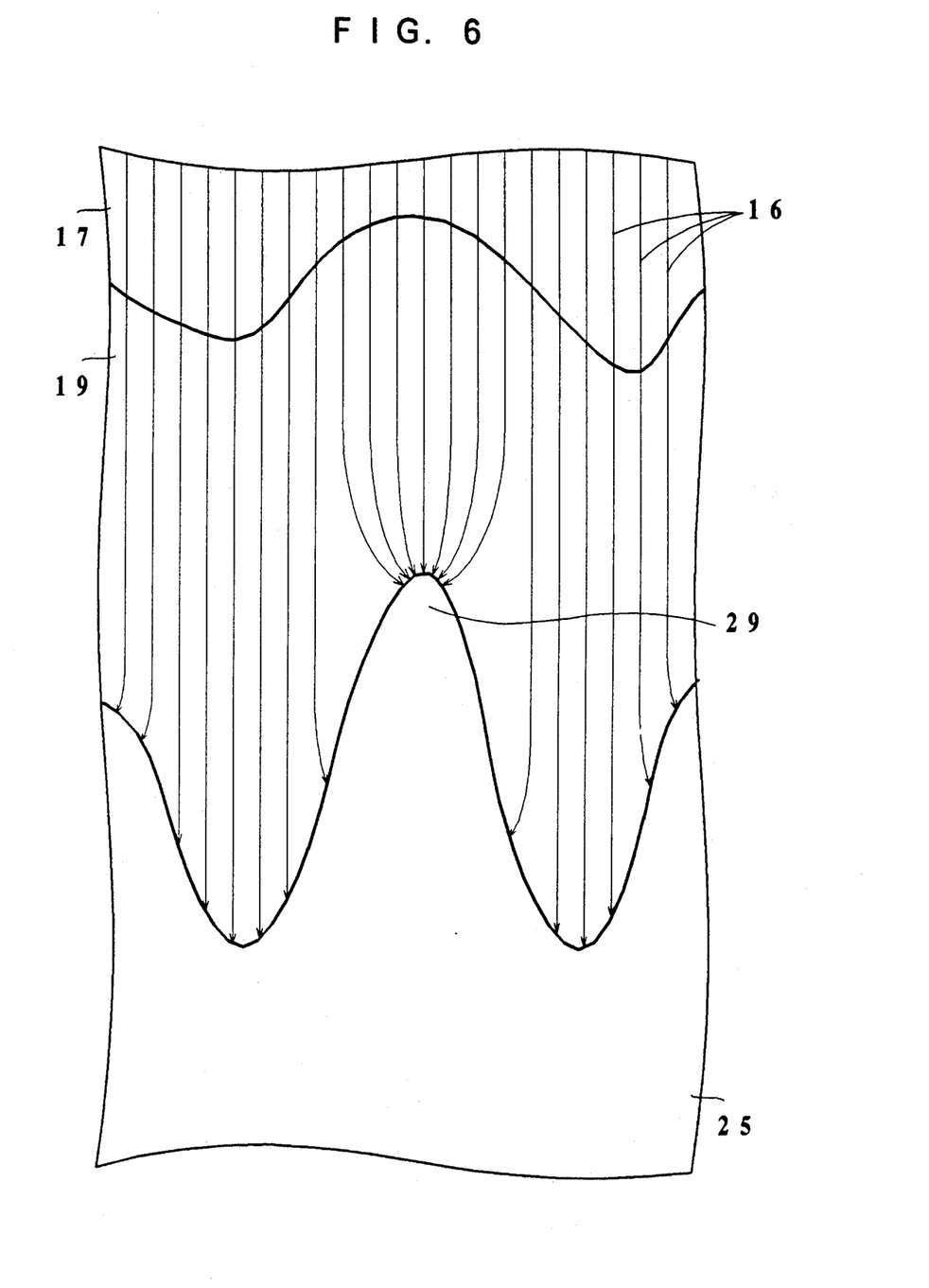
FIG. 6 is a view showing local enhancement of the electric field by a raised portion of a channel region in an embodiment of the present invention.

To erase the information "1", the trapped electrons need to be returned to the channel region 25. By applying a voltage of only about 15 V to the channel region 25, an electric field is generated of the opposite polarity to that applied in the case of writing information. Like the case of writing, the electric field generated is locally enhanced by the projecting portions 29. That is, on the surface of the channel region 25, the projecting portions 29 have a strong electric field compared to the other portions. In other word, even with a voltage of 15 V, the trapped electrons can be pulled out by the effect of the electric field. The numerous trapped electrons are thus returned to the channel region 25. The memory cell 2 with the information "0" stored therein is a depletion mode transistor.

Figure 4B:
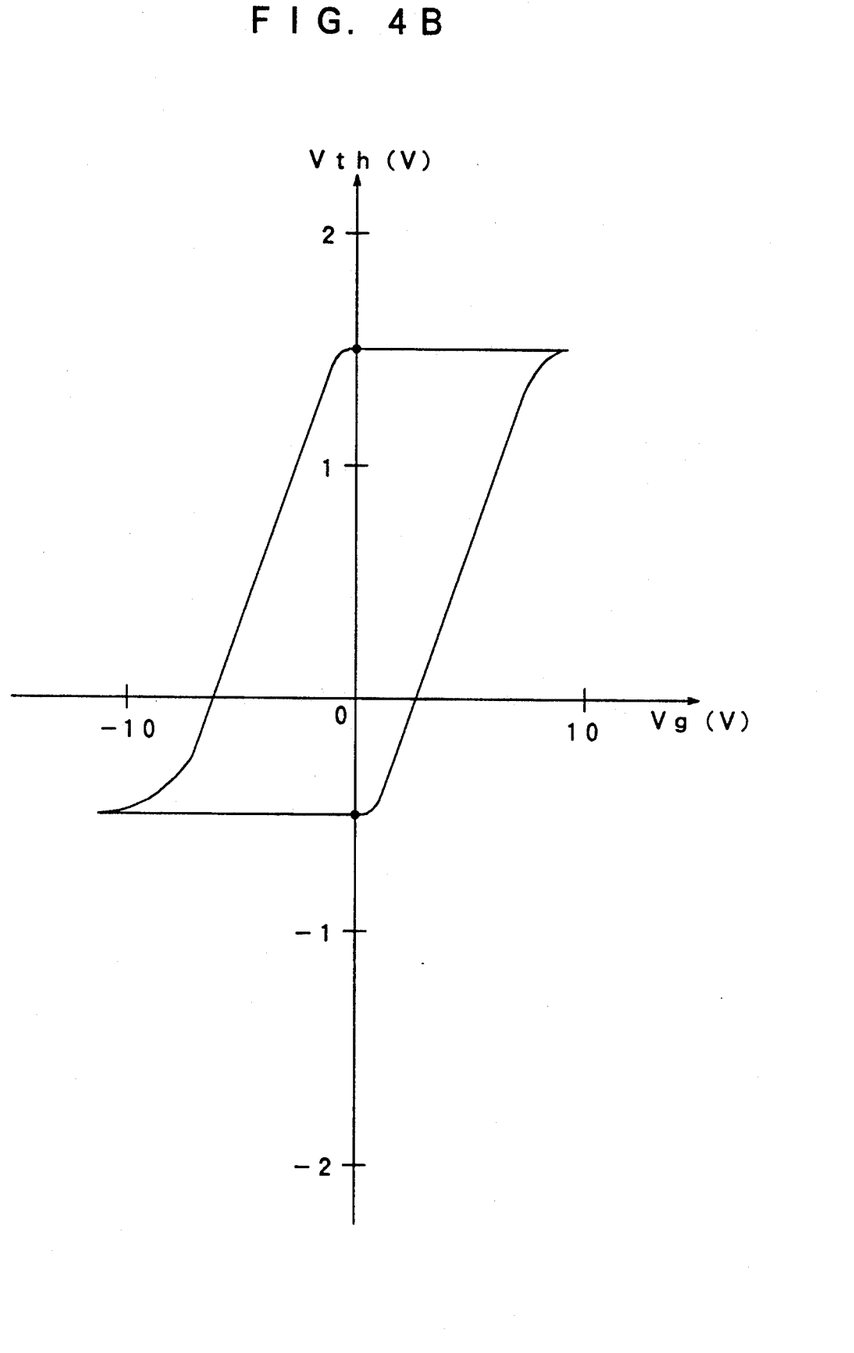
FIG. 4B is a view showing the hysteresis loop of the memory cell 2.

In other word, by applying the voltage for writing or erasing the information, the threshold voltage of the memory cell 2 can change (see FIG. 4B).

When reading information, whether the stored information is "0" or "1" can be determined by checking whether a current flows through the channel region 25 when a voltage of about 5 V is applied between the source 23 and drain 21 of the memory cell 2.

More specifically, when information "0" is stored (i.e., when no electrons are trapped in the SiN film 17), the memory cell 2 is a depletion mode transistor, and the channel region 25 of the memory cell 2 is thus conductive. Thus, current flows through the channel region 25. On the other hand, when information "1" is stored (i.e., electrons are trapped in the SiN film 17), the memory cell 2 is an enhancement mode transistor. The channel region 25 is thus not conductive, and no current flows through the channel region 25.

An example of a memory circuit using the above memory cell 2 will now be described.

Figure 7:
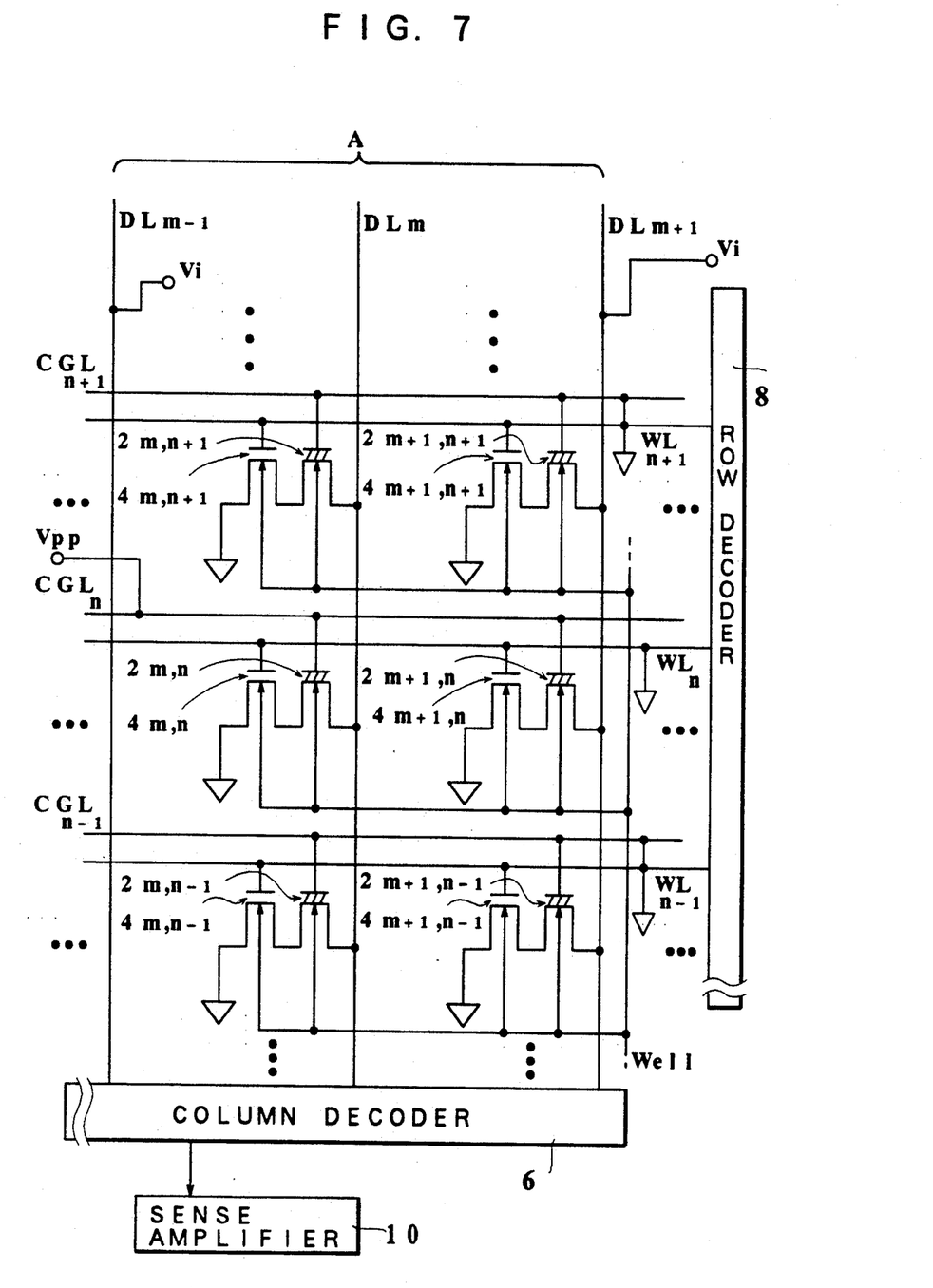
FIG. 7 is a schematic of a memory LSI structure for explaining the principles of writing information to the memory cell embodying the present invention.

The principles underlying the writing operation will first be described. FIG. 7 is a schematic of the structure of a 1024-bit memory LSI.

A memory array A has 32 (lines) by 32 (columns), i.e., a total of 1,024 (or 1K) bits of memory cells 2 arranged in a matrix array. The drain of a selection transistor 4 is connected to the source of each memory cell 2. Leading from a decoder 8 are word lines WL connected to the gate electrode of each selection transistor 4. Control gate lines CGL are connected to the gate electrode 14 of each memory cell 2. Data lines DL leading from a column decoder 6 are connected to the drain 21 of each memory cell 2. A well line WELL is connected to the silicon substrate 27.

The case of writing information, to memory cells 2m,n, will now be considered. A programming voltage Vpp is applied to the control gate lines CGLn only. At this time, a programming inhibition voltage Vi is applied from the decoder 6 to the data lines other than the data line DLm. To the word line WLn, a ground voltage is applied of the same potential as the substrate potential. Thus, of the memory cells 2, each having their gates connected to control gate lines CGLn with the programming voltage Vpp applied thereto, only the memory cell 2m,n, which has its drain connected to data lines DLm with the programming inhibition voltage Vi not applied thereto, has its drain, source and substrate held at "0" potential. That is, it is only in the memory cell 2m,n that has electrons from the channel region are trapped in the SiN film 17 by the electric field effect provided by the programming voltage Vpp. In this way, information "1" is written in only memory cell 2m,n.

Now, the principles underlying the operation of reading information from memory cell 2m,n will be described with reference to FIG. 8.

Figure 8:
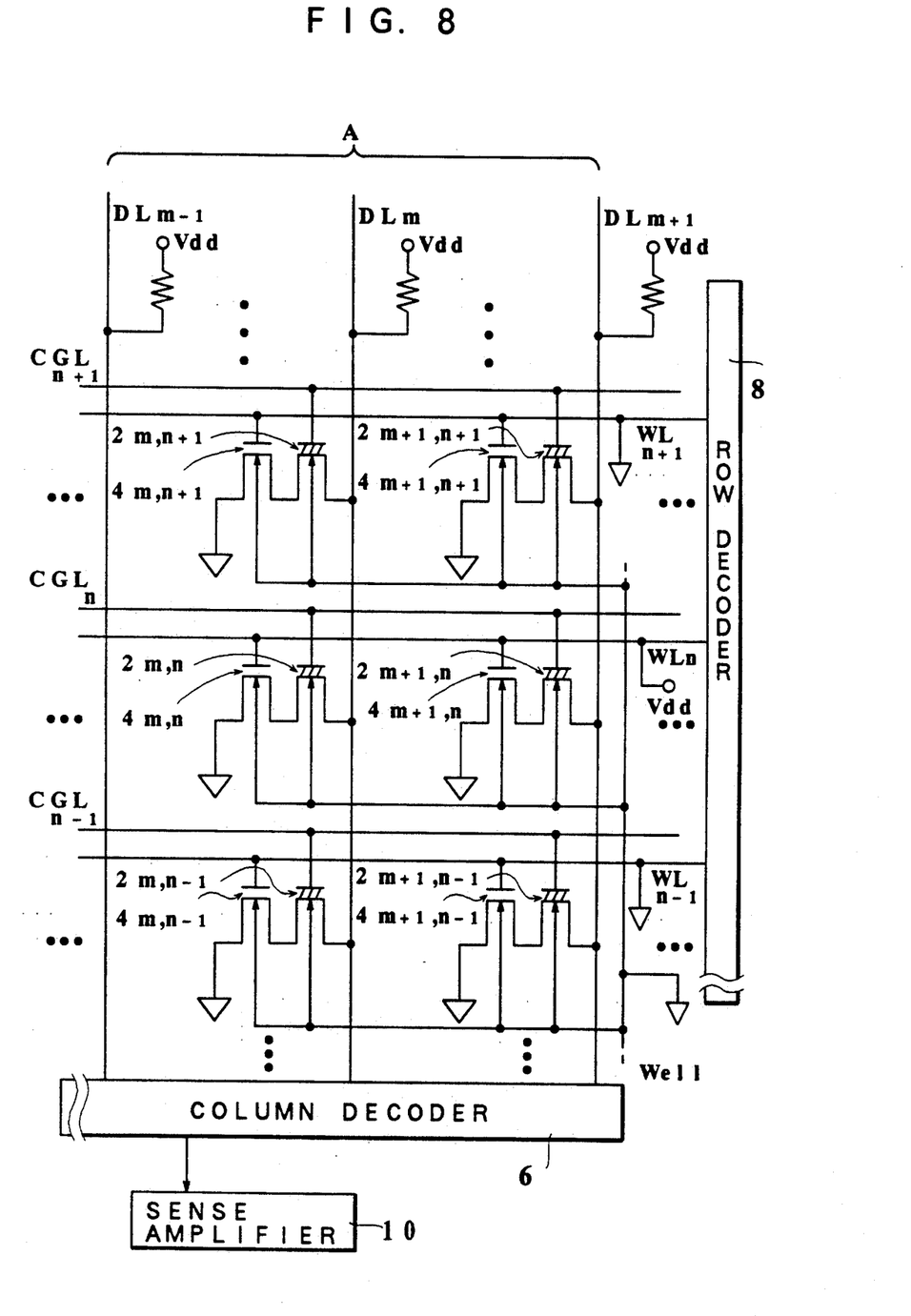
FIG. 8 is a schematic of the memory LSI structure for explaining the principles of reading information from the memory cell embodying the present invention.

The structure shown in FIG. 8 is the same as the structure shown in FIG. 7. Voltage Vdd is applied to the word line WLn only from the row decoder 8. The voltage Vdd is also applied via a resistor 30 to all the data lines DL. At this time, when the memory cell 2m,n have the information "1" (i.e., electrons are trapped in the SiN film 17), the channel region 25 is not conductive, and current in data line DLm is directly supplied to the column decoder 6. Meanwhile, when the memory cell 2m,n have the information "0" (i.e., no electrons are trapped in the SiN film 17), the channel region 25 is conductive. Thus, when the associated selection transistor 4m,n is turned on with application of the voltage Vdd to the gate electrode via the word line WLn, current flows out of the associated data line DLm and flows through the memory cell 2 and the associated selection transistor 4m,n to the ground potential. The column decoder 6 is arranged to put out only the current from the data line DLm. The output is amplified and read by the sense amplifier 10.

Figure 9:
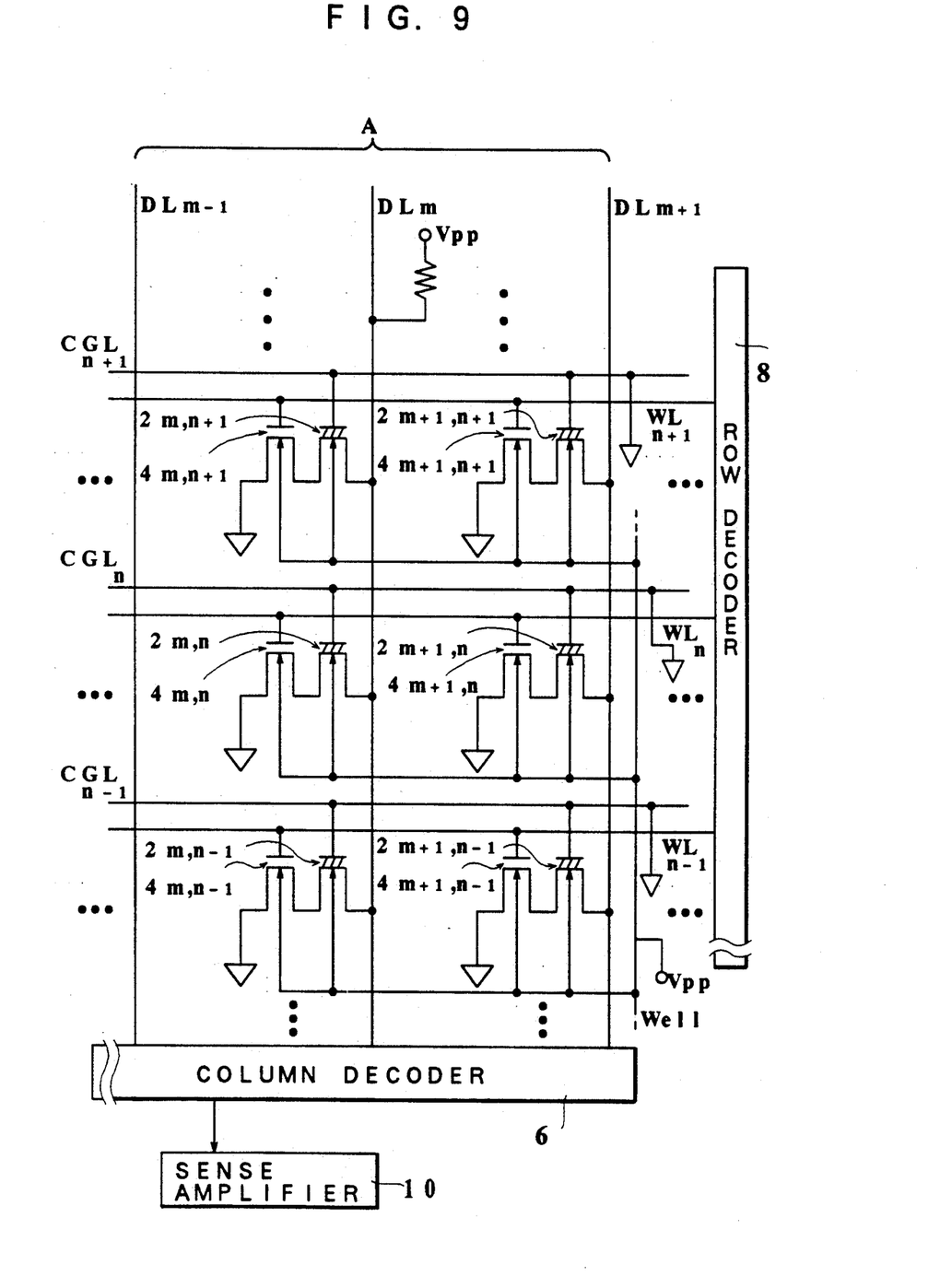
FIG. 9 is a schematic of a memory LSI structure for explaining the principles of erasing information stored in the memory cell embodying the present invention.

The principles underlying the operation of erasing all information stored in the 1,024-bit memory LSI will now be described with reference to FIG. 9. The structure shown in FIG. 9 is the same as the structure shown in FIG. 7. After grounding each control gate CG line, the programming voltage Vpp is applied to the silicon substrate 27 of each memory cell 2 via the well line Well. At this time, the trapped electrons are returned to the channel region 25 by the electric field effect. That is, all written information "1" is erased, and information "0" is written in all the memory cells 2.

The above structure is of a semiconductor memory employing the memory cell 2.

In the embodiment shown in FIG. 4A, the silicon dioxide film 19, as the first insulating film, is a thin film with a thickness of about 2 nm. But it is also possible to vary the thickness of the silicon dioxide film, so long as tunneling effect can be produced by voltage application at the levels described herein. The greater the thickness of the silicon dioxide film, the more difficult it is to courage return of the electrons trapped in the SiN film to the channel region (which is called back tunneling).

Further, in the above embodiment the first and second conductivity types are respectively p- and n-types. However, the first and second conductivity types may be n- and p-types respectively.

A feature of the semiconductor memory of the present invention is that the surface of the third region is formed with projecting portions.

This permits ready tunneling of electrons, from the third region through the first insulating film, to be effected by the electric field, which is locally enhanced by the projecting portions when writing information (i.e., when voltage is applied to the gate electrode). Additionally, when erasing information (i.e., when voltage is applied to the third region), the above feature permits ready tunneling of the electrons trapped in the second insulating film to be effected by the electric field, locally enhanced by the projecting portions. More specifically, with a first insulating film of the same thickness, writing and erasing of information can be effected with a programming voltage which is low compared to the prior art.

By enabling the writing and erasing of information to be effected with a reduced voltage, it is possible to alleviate stress on the first insulating film. In addition, the memory cell need not be of high breakdown voltage structure, and its volume can be reduced, which is useful for increasing integration density. Further, the manufacturing process can be simplified, improving manufacturing efficiency.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A semiconductor device comprising:
   a semiconductor region of a first conductivity type;
   first and second regions of a second conductivity type formed in said first conductivity type semiconductor region;
   a third region defined between said first and second regions, the surface of said third region having a plurality of projecting portions each having a top portion narrower in width than a base portion thereof;
   a first insulating film formed on said projecting portions;
   a second insulating film formed on said first insulating film; and
   a gate electrode formed on said second insulting film; whereby injection of carriers into said second insulating film is made through said first insulating film, with enhanced efficiency by said projecting portions.

2. A semiconductor device according to claim 1, wherein silicon single crystal is used as the semiconductor.

3. A semiconductor device according to claim 2, wherein said first and second regions of the second conductivity type are respectively source and drain layers, and said third region is a channel region.

4. A semiconductor device according to claim 3, wherein said first and second conductivity types are n- and p-types, respectively.

5. A semiconductor device according to claim 3, wherein said first and second conductivity types are p- and n-types respectively.

6. The semiconductor device according to claim 5, wherein said first and second insulating films are silicon dioxide and SiN films respectively.

* * * * *